(12) United States Patent
You et al.

(10) Patent No.: US 12,340,993 B2
(45) Date of Patent: Jun. 24, 2025

(54) NON-INVASIVE DIAGNOSTIC METHOD AND APPARATUS FOR PLASMA PROCESSES

(71) Applicant: THE INDUSTRY & ACADEMIC COOPERATION IN CHUNGNAM NATIONAL UNIVERSITY, Daejeon (KR)

(72) Inventors: Shinjae You, Daejeon (KR); Sangho Lee, Seoul (KR); Sijun Kim, Daejeon (KR); Jangjae Lee, Daejeon (KR); Yeongseok Lee, Jeju-si (KR); Junghyeng Kim, Daejeon (KR)

( * ) Notice: Subject to any disclaimer, the term of this patent is extended or adjusted under 35 U.S.C. 154(b) by 574 days.

(21) Appl. No.: 17/770,648

(22) PCT Filed: Jan. 8, 2020

(86) PCT No.: PCT/KR2020/000321
§ 371 (c)(1),
(2) Date: Apr. 21, 2022

(87) PCT Pub. No.: WO2021/080089
PCT Pub. Date: Apr. 29, 2021

(65) Prior Publication Data
US 2022/0384163 A1    Dec. 1, 2022

(30) Foreign Application Priority Data

Oct. 23, 2019  (KR) .......................... 10-2019-0132290

(51) Int. Cl.
*H01J 47/00* (2006.01)
*H01J 37/32* (2006.01)

(52) U.S. Cl.
CPC .... *H01J 37/32972* (2013.01); *H01J 37/3222* (2013.01)

(58) Field of Classification Search
CPC .................... H01J 37/32972; H01J 37/3222
See application file for complete search history.

(56) References Cited

U.S. PATENT DOCUMENTS

2002/0047543 A1\*  4/2002  Sugai ................... H05H 1/0062
315/111.21

FOREIGN PATENT DOCUMENTS

CN    106556577 A  \*  4/2017  ........... G01N 21/553
JP    2010-232110 A    10/2010
(Continued)

OTHER PUBLICATIONS

International Search Report for PCT/KR2020/000321 mailed on Jul. 23, 2020.

*Primary Examiner* — Henry Luong

(57) ABSTRACT

Proposed are non-invasive diagnostic method and apparatus for plasma processes in which plasma processes can be monitored in real time by measuring a surface wave resonance frequency generated in plasma or a sheath on the basis of a surface wave resonance principle. The diagnostic method may include a step (S10) of installing at least one probe on one side of an electrostatic chuck (ESC) or on an inner wall of a chamber, a step (S20) of emitting a high frequency onto the plasma or the sheath by the probe, and a step (S30) of detecting a frequency reflected from the plasma or the sheath by the probe. In addition, the diagnostic method may include the step (S40) of extracting a reflection spectrum, a step (S50) of extracting the surface wave resonance frequency, and a step (S60) of extracting electron density or uniformity of the plasma.

7 Claims, 17 Drawing Sheets

(56) References Cited

FOREIGN PATENT DOCUMENTS

| JP | 2017-069212 | A | 4/2017 |
|---|---|---|---|
| KR | 10-0476460 | B1 | 3/2005 |
| KR | 10-2017-0028094 | A | 3/2017 |
| WO | 2004/015364 | A1 | 2/2004 |
| WO | 2005/017937 | A2 | 2/2005 |

* cited by examiner

NON-INVASIVE DIAGNOSTIC METHOD AND APPARATUS FOR PLASMA PROCESSES

TECHNICAL FIELD

The present disclosure relates generally to non-invasive diagnostic method and apparatus for plasma processes. More particularly, the present disclosure relates to non-invasive diagnostic method and apparatus for plasma processes in which plasma processes can be monitored in real time by measuring a surface wave resonance frequency generated in plasma or a sheath on the basis of a surface wave resonance principle.

BACKGROUND ART

Generally, a plasma process (plasma etching, plasma deposition, and plasma cleaning, etc.) accounts for about 30% of a total process in manufacturing industries such as semiconductors, solar cells, and flat panel displays, and the importance of the plasma process is rising now. Particularly, recently, in an associated industry, a plasma process using a liquid-perfluorocarbon (L-PFC) precursor with a low global warming potential is emerging.

The efficiency and productivity of such a plasma process are closely related to plasma parameters, and electron density among the plasma parameters is known as one of important real-time process monitoring parameters of plasma.

For this reason, many microwave plasma diagnostic methods have been developed for diagnosing the density of plasma from the past. In addition, a conventional reflective plasma diagnosis method using microwaves secures high measurement accuracy.

However, such a conventional diagnostic method has the following problems in the application of real-time plasma process monitoring. First, most plasma diagnostic methods using microwaves have invasive antenna structures, which causes a problem such as the shape of an antenna being transferred to a wafer in the plasma process.

Second, most diagnostic methods of measuring reflected waves of microwaves use a structure resonance phenomenon, so an antenna is required to be large and thus is difficult to be mounted inside a chamber. Third, there is a problem that in order to use the structure resonance phenomenon, a reference spectrum is necessarily required before plasma discharge. Accordingly, when the reference spectrum is changed due to deposits on the inner wall of the chamber during the plasma process, a very large error may occur.

DOCUMENT OF RELATED ART

Korean Patent No. 10-0476460 (published on Mar. 17, 2005)

DISCLOSURE

Technical Problem

Accordingly, a technical objective to be achieved by the present disclosure is to solve the disadvantages of the prior art, and the present disclosure is intended to propose a non-invasive antenna structure for plasma process diagnosis. In addition, the present disclosure is intended to propose diagnostic method and apparatus for a plasma process in which the apparatus is not sensitive to RF noise and can be miniaturized to be mounted inside a chamber in which plasma is generated.

Furthermore, the present disclosure is intended to accurately monitor a plasma process by reducing discrepancy of resonance frequency measured for plasma process diagnosis. Additionally, the present disclosure is intended to measure in real time the density and uniformity of plasma located directly above a wafer, which is important in the plasma process.

Technical Solution

In order to accomplish the above technological objectives, a non-invasive diagnostic method for diagnosing plasma in a plasma process according to one aspect of the present disclosure may include a step (S10) of installing at least one probe on one side of an electrostatic chuck (ESC) or an inner wall of the chamber; a step (S20) of emitting a high frequency onto the plasma or a sheath by the probe; and a step (S30) of detecting a frequency reflected from the plasma or the sheath by the probe.

In addition, the non-invasive diagnostic method may include: a step (S40) of extracting a reflection spectrum by frequency by using the frequency detected by the probe; a step (S50) of extracting a surface wave resonance frequency of the plasma or the sheath by using the frequency detected by the probe or the reflection spectrum; and a step (S60) of extracting electron density or uniformity of the plasma on the basis of the surface wave resonance frequency.

In addition, the non-invasive diagnostic apparatus for plasma processes according to another aspect of the present disclosure may include the probe, a high frequency generation unit, a control part, a measuring unit, a calculation unit, a storage part, and a display part. The high frequency generation unit may generate a high frequency according to the control of the control part and may transmit the high frequency to the probe.

Furthermore, the probe may emit a high frequency onto the plasma or the sheath, and may detect a frequency reflected from the plasma or the sheath. In this case, the probe may be configured to have a shape of a coaxial cable, and a coaxial core of the probe may be made of a metal material, and a coaxial peripheral of the probe may be made of a dielectric.

The measuring unit may measure the frequency detected by the probe. In addition, the calculation unit may calculate the surface wave resonance frequency of the plasma or the sheath by using the frequency detected by the probe or data measured by the measuring unit, and may extract the electron density or uniformity of the plasma by using the calculated surface wave resonance frequency.

The control part may control the probe, the high frequency generation unit, the measuring unit, the calculation unit, and the display part, and may monitor the plasma process on the basis of results calculated by the calculation unit.

Advantageous Effects

As described above, the non-invasive diagnostic method and apparatus for plasma processes according to the present disclosure can, in real time, measure the density and uniformity of plasma located directly above a wafer, which is important in the plasma process, by measuring resonance frequency generated between plasma and a sheath on the basis of a surface wave resonance principle. Additionally, the discrepancy of resonance frequency measured for plasma process diagnosis is reduced to accurately monitor the plasma process, thereby improving the stabilization and yield of the plasma process.

In addition, according to the non-invasive diagnostic method and apparatus for plasma processes, a non-invasive antenna structure may be used to diagnose the plasma process without the shape of an antenna being transferred to a wafer. Furthermore, the diagnostic apparatus is not sensitive to RF noise, and can have a miniaturized antenna, thereby enabling the antenna to be mounted inside the chamber in which plasma is generated.

BEST MODE

Figure 1:
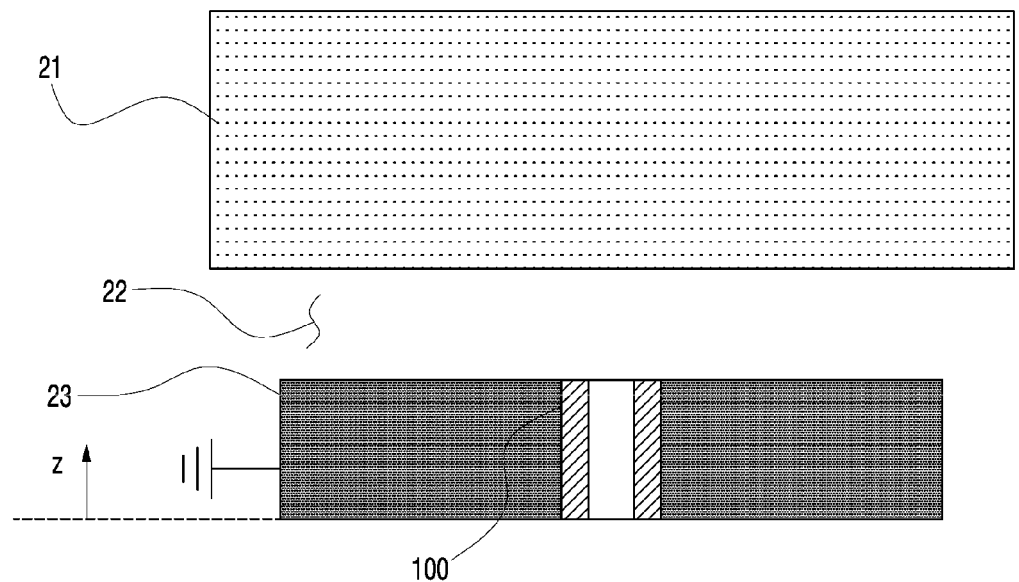
FIGS. 1 and 2 are views roughly illustrating the configuration of a non-invasive diagnostic apparatus for plasma processes according to an embodiment of the present disclosure.

Hereinafter, with reference to the accompanying drawings, embodiments of the present disclosure will be described in detail such that those skilled in the art can easily implement a non-invasive diagnostic apparatus for plasma processes according to the present disclosure. However, the diagnostic apparatus of the present disclosure may be implemented in several different forms and is not limited to the embodiments described herein. Additionally, in order to clearly explain the present disclosure through the drawings, parts irrelevant to description thereof are omitted, and similar reference numerals are assigned to similar parts throughout the specification.

Throughout the specification, when a part "includes" a certain component, it means that other components may be further included, rather than excluding other components, unless otherwise stated. Furthermore, terms such as " . . . part", " . . . group", and " . . . module", etc. described in the specification mean a unit that processes at least one function or operation, which may be implemented in hardware or software or a combination of hardware and software.

Hereinafter, the present disclosure will be described in detail by describing the exemplary embodiments of the present disclosure with reference to the accompanying drawings.

Like reference numerals in each figure indicate like members.

Figure 2:
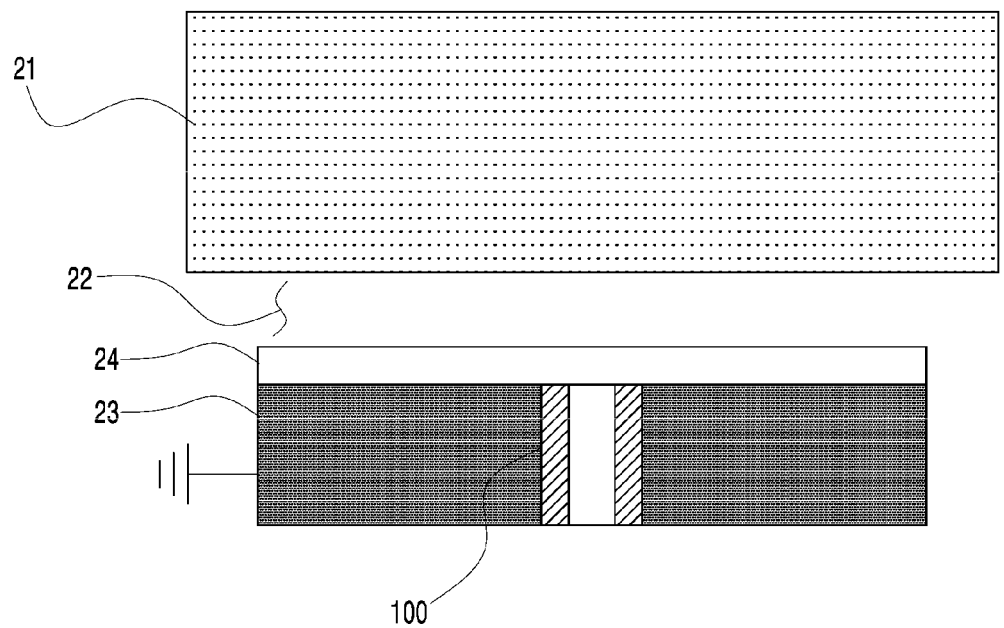
Figure 3:
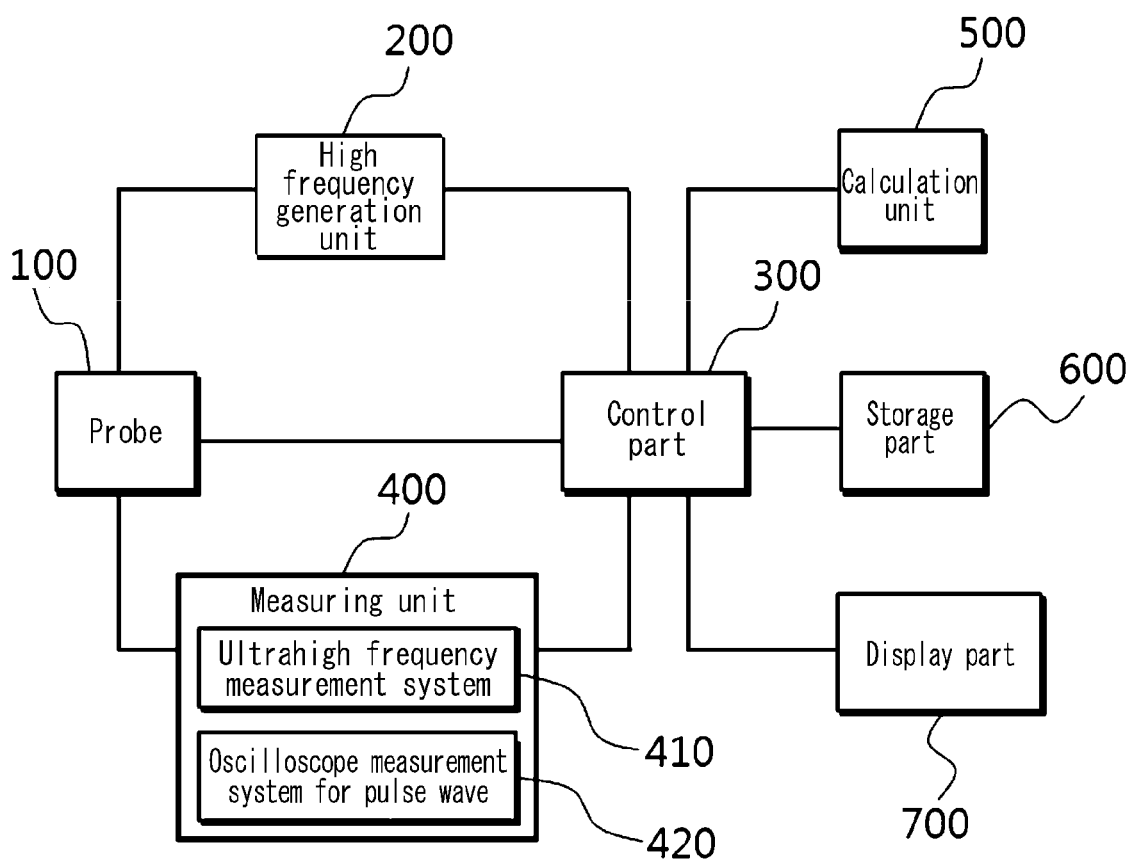
FIG. 3 is a block diagram illustrating the non-invasive diagnostic apparatus for plasma processes according to the embodiment of the present disclosure.

FIGS. 1 and 2 are views roughly illustrating the configuration of the non-invasive diagnostic apparatus for plasma processes according to an embodiment of the present disclosure. Additionally, FIG. 3 is a block diagram illustrating the non-invasive diagnostic apparatus 10 for plasma processes according to the embodiment of the present disclosure, and FIG. 4 is a perspective view illustrating a probe 100 according to the embodiment of the present disclosure.

That is, FIG. 1 is a view illustrating the shapes of the plasma 21 and the probe 100 which is disposed on one side of an electrostatic chuck (ESC) 23, and FIG. 2 is a view illustrating the probe 100 disposed on one side of the electrostatic chuck (ESC) 23 when a wafer 24 is provided on the electrostatic chuck (ESC) 23.

Figure 4:
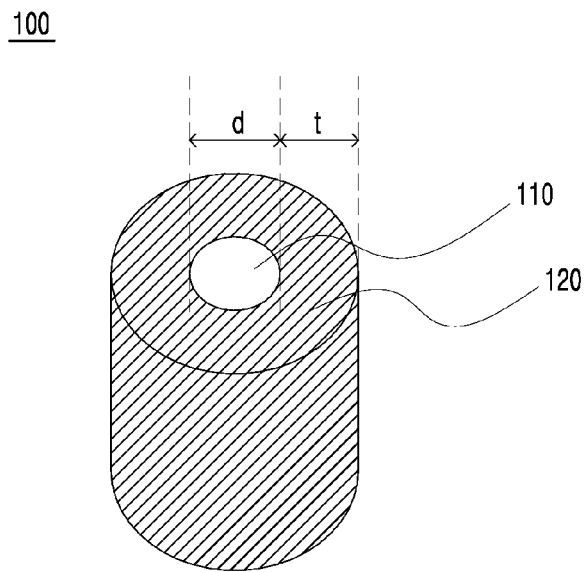
FIG. 4 is a perspective view illustrating a probe according to the embodiment of the present disclosure.

In addition, FIG. 4 is a view three-dimensionally illustrating the probe 100 of FIGS. 1 and 2. For example, in FIG. 4, a diameter d of a coaxial core 110 of the probe 100 may be preset to be 2 mm, and thickness t of a dielectric of a coaxial peripheral 120 may be preset to be 1.0 mm.

The non-invasive diagnostic method and apparatus 10 for plasma processes according to the embodiment of the present disclosure relates to the non-invasive diagnostic method and apparatus 10 for plasma processes in which the density and uniformity of the plasma 21 are monitored in real time on the basis of the principle of surface wave resonance generated in the plasma 21 or the sheath 22 without being based on a structure resonance principle used in the conventional reflective plasma diagnosis method.

The non-invasive diagnostic method and apparatus 10 for plasma processes according to the embodiment of the present disclosure may be verified by using electromagnetic simulation. In this case, the electromagnetic simulation may be extracted by calculating Maxwell's equation based on a finite-difference time-domain (FDTD) method.

The FDTD method is one of electromagnetic field numerical analysis techniques, in which a differential equation obtained from the differential form of Maxwell's equation is used to relatively easily analyze an initial boundary value problem.

That is, the FDTD method is a numerical analysis technique used for modeling electrodynamics. In addition, an FDTD solution is a time-domain method in which a wide frequency range can be covered with a single simulation run and nonlinear material properties can be treated in a natural way.

The FDTD method is currently being applied in a wide range of fields, and application fields of the FDTD method may be divided into five major categories. First, the FDTD method can analyze EMI/EMC problems such as shielding, electromagnetic coupling, lightning, electromagnetic pulse (EMP) phenomena, and packaging.

Second, the FDTD method can analyze problems related to scattering and a radar cross section (RCS), and third, can analyze the biological hazards of electromagnetic waves on the human body. Fourth, the FDTD method can calculate a radiation pattern and input impedance, etc. in an antenna problem, and finally, can analyze ultrahigh frequency active and passive device circuits and waveguides. Accordingly, the FDTD method is widely used in almost all electromagnetic fields to the extent that there is almost no field to which the FDTD method is not applied.

As illustrated in FIG. 3, the non-invasive diagnostic apparatus 10 for plasma processes according to the embodiment of the present disclosure may include the probe 100, a high frequency generation unit 200, a control part 300, a measuring unit 400, a calculation unit 500, a storage part 600, and a display part 700.

The high frequency generation unit 200 generates high frequency according to the control of the control part 300 and transmits the high frequency to the probe 100. The probe 100 emits high frequency onto the plasma 21 or the sheath 22, and detects a signal reflected from the plasma 21 or the sheath 22.

That is, as illustrated in FIG. 4, the probe 100 may be a transmitting/receiving antenna which transmits a high frequency and receives a reflected frequency.

The measuring unit 400 measures a signal detected by the probe 100. In this case, the measuring unit 400 may include an ultrahigh frequency radiation/measurement system 410 such as a network analyzer or an oscilloscope measurement system 420 for pulse waves.

The calculation unit 500 calculates the density and uniformity of the plasma 21 by using data measured by the measuring unit 400. That is, the calculation unit 500 calculates a surface wave resonance frequency $f_{SWR}$ of the plasma 21 by using signals detected by the probe 100 or data measured by the measuring unit 400 and can calculate the electron density and uniformity of the plasma 21 by using the calculated surface wave resonance frequency $f_{SWR}$.

The control part 300 may control the probe 100, the high frequency generation unit 200, the measuring unit 400, the calculation unit 500, and the display part 700, and may monitor the process of the plasma 21 on the basis of results calculated by the calculation unit 500.

In addition, the storage part 600 stores data measured by the measuring unit 400 and the results calculated by the calculation unit 500. Furthermore, the display part 700 may display data of the probe 100 or the measuring unit 400.

That is, the display part 700 may display resonance frequency extracted by using the reflection spectrum according to a frequency on the basis of data detected by the probe 100 or the measuring unit 400. Furthermore, the display part 700 may display an electric field distribution image for each frequency or for each electric field intensity.

In addition, FIGS. 1 and 2 illustrate a domain including a boundary condition used in the electromagnetic simulation, and the probe 100 functioning as a radiating and transmitting antenna. In this case, the plasma 21 may approximate to a dielectric whose dielectric constant is shown in [Equation 1] below by using Drude model.

$$\epsilon_p(\omega) = \epsilon_0\left(1 - \frac{\omega_{pe}}{\omega(\omega - jv_m)}\right) \quad \text{[Equation 1]}$$

Here, $\epsilon_p(\omega)$ is the dielectric constant of the plasma 21, $\epsilon_0$ is dielectric constant in vacuum, $\omega_{pe}$ is the angular frequency of the plasma 21. In addition, $\omega$ is angular frequency of an applied electromagnetic wave, and the imaginary term $v_m$ denotes collision frequency between electrons and neutral species.

In addition, according to the embodiment of the present disclosure, the plasma 21 may use a cylindrical shape with a diameter of 330 mm and a height of 40 mm on the basis of a cylindrical chamber 20.

Furthermore, the angular frequency of the plasma 21 can be extracted by using [Equation 2] below.

$$\omega_{pe} = \left(\frac{e^2 n_e^{input}}{\epsilon_0 m_e}\right)^{1/2} \quad \text{[Equation 2]}$$

Here, $n_e^{input}$ is input electron density, e is the charge amount of an electron, and $m_e$ is the mass of the electron. In addition, in the electromagnetic simulation according to the embodiment of the present disclosure, the collision frequency between electrons and neutral species considers only momentum transfer collision reaction with respect to argon gas, and assumes an electron temperature of 1.0 eV.

Furthermore, the sheath 22 approximates to a dielectric having a relative dielectric constant of 1.0, and the thickness of the sheath 22 may be defined as a simulation variable. Additionally, the electrostatic chuck (ESC) 23 assumes a cylinder having a diameter of 70 mm and a height of 20 mm for simulation.

As illustrated in FIG. 4, the probe 100 may be an antenna composed of the coaxial core 110 provided inside the probe and the coaxial peripheral 120 of the probe and having the structure of a coaxial tube or coaxial cable. Here, the coaxial core 110 is made of a metal material, and the coaxial peripheral 120 may be made of a dielectric. For example, the coaxial peripheral 120 may be made of Teflon having a dielectric constant $\epsilon_r$ of 2.1.

In addition, in the probe 100, the diameter of the coaxial core 110 is defined as a variable "a", and the thickness of the dielectric used for the coaxial peripheral 120 is defined as a variable "c", and the probe is disposed on one side of the electrostatic chuck (ESC) 23.

For a boundary condition for simulation, a ground boundary condition is used ($\vec{E}_t=0$) in a boundary surface in which a z-axis value is 0, and an open boundary condition is used in boundary surfaces other than the boundary surface.

Figure 5:
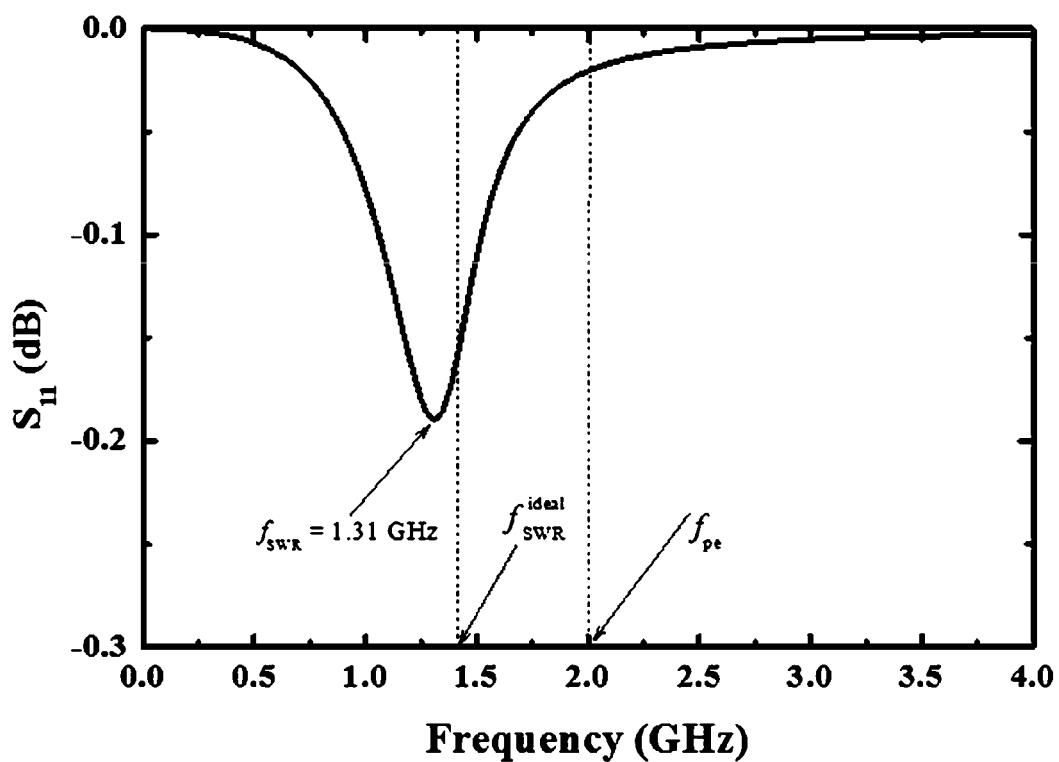
FIG. 5 is a graph illustrating a reflection spectrum according to the embodiment of the present disclosure.

FIG. 5 is a graph illustrating the reflection spectrum according to the embodiment of the present disclosure. That is, FIG. 5 is a graph illustrating a reflection spectrum by frequency, an ideal surface wave resonance frequency $f_{SWR}^{ideal}$, and the surface wave resonance frequency $f_{SWR}$ on the spectrum in a case in which the thickness of the sheath 22 is 1.0 mm, the input electron density is $5\times10^{10}$ cm$^{-3}$, and pressure is 1.0 torr.

In addition, FIG. 5 is a graph of the reflection spectrum extracted by performing the electromagnetic simulation in a case in which in the probe 100, the diameter d of the coaxial core 110 is 2 mm, and the thickness t of the coaxial peripheral 120 is 1.0 mm. Here, in the graph, each of the ideal surface wave resonance frequency $f_{SWR}^{ideal}$ of 1.41 GHz and the plasma vibration frequency $f_{pe}$ of 2.01 GHz is indicated by a dotted line.

Figure 6:
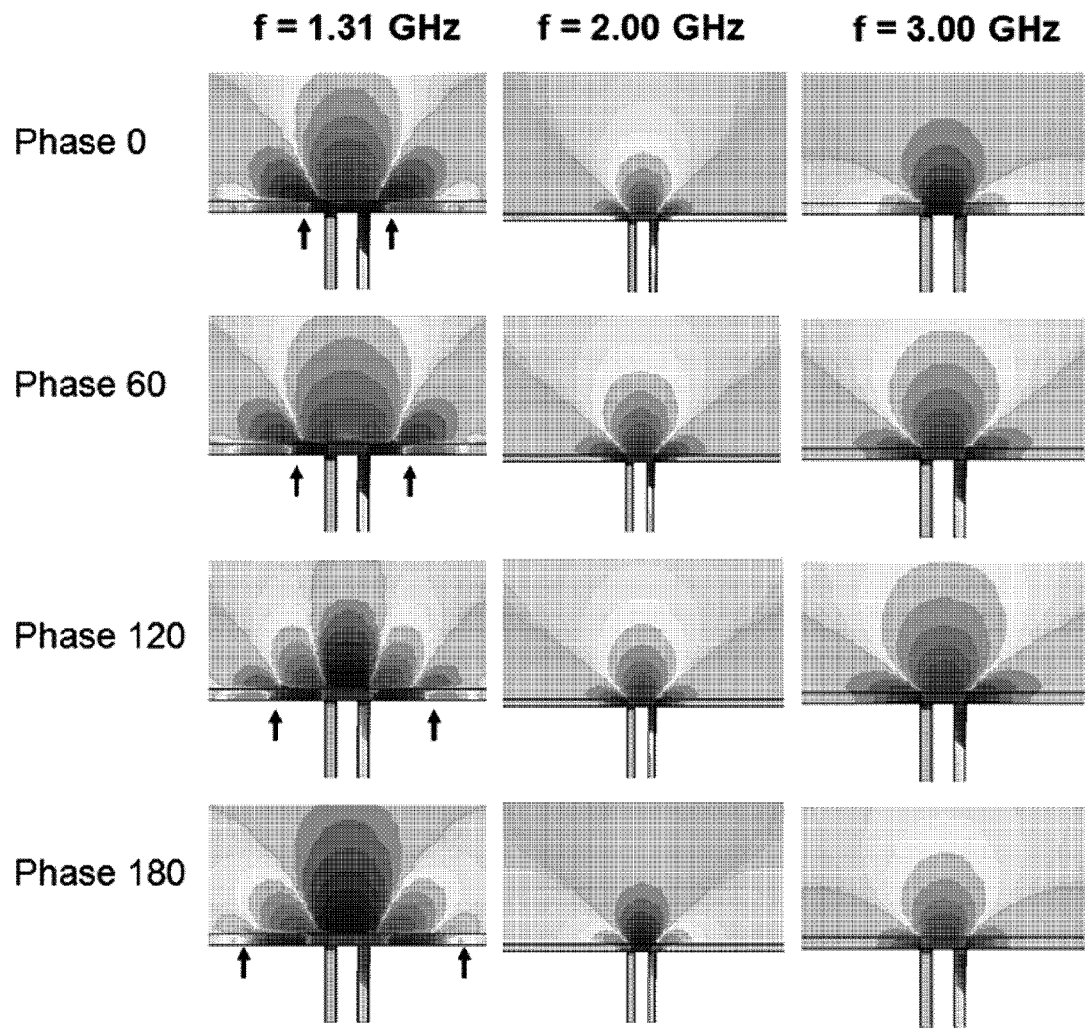
FIG. 6 is a view illustrating electric field distribution according to the embodiment of the present disclosure.

FIG. 6 is a view illustrating the electric field distribution according to the embodiment of the present disclosure. That is, FIG. 6 is a view illustrating the electric field distribution image according to a phase change in a z-axis direction in frequency of 1.31 GHz having a minimum value and frequencies f of 2.00 GHz and 3.00 GHz in the reflection spectrum FIG. 5. Here, a black arrow indicates a position change according to a phase change of any one position among the positions of surface waves.

Furthermore, in each graph, a color represents electric field strength. That is, as the electric field strength increases, the electric field distribution is close to red, and as the electric field strength decreases, the electric field distribution is close to blue.

As illustrated in FIG. 6, it can be seen that a surface wave is oscillating in the frequency of 1.31 GHz having a minimum value in the reflection spectrum. Furthermore, it can be seen that an electric field exhibits a radiation form in frequencies of 2.00 GHz and 3.00 GHz.

Accordingly, frequency having the minimum value in the reflection spectrum may be defined as a surface wave resonance frequency $f_{SWR}$.

The non-invasive diagnostic apparatus 10 for plasma processes according to the embodiment of the present disclosure is based on the principle of the surface wave resonance frequency generated on a boundary surface of the plasma 21 or the sheath 22, and thus can measure the plasma 21 located above the wafer 24, which is the most important in the plasma process.

Resonance frequency $f_{SWR}^{ideal}$ at which a surface wave can oscillate on a boundary surface of the plasma 21 or the sheath 22 can be expressed by [Equation 3] below.

$$f_{SWR}^{ideal}=f_{pe}/\sqrt{2} \quad \text{[Equation 3]}$$

Here, $f_{pe}$ is the vibration frequency of the plasma 21. Accordingly, the density $n_e$ of the plasma 21 located above the wafer 24 can be extracted by [Equation 4] below.

$$n_e=(f_{SWR}^{ideal}/6350)^{1/2} \quad \text{[Equation 4]}$$

Here, $n_e$ is the density of the plasma 21 located above the wafer 24.

As illustrated in FIG. 5, it can be seen that there is difference between the ideal surface wave resonance frequency $f_{SWR}^{ideal}$ and the measured surface wave resonance frequency $f_{SWR}$. The difference between these resonance frequencies according to the embodiment of the present disclosure is defined as discrepancy, and the discrepancy can be extracted by using [Equation 5] below.

$$|\text{discrepancy}|=(f_{SWR}-f_{SWR}^{ideal})/f_{SWR}^{ideal}\times 100(\%) \quad \text{[Equation 5]}$$

Here, 'discrepancy' is the discrepancy of the surface wave resonance frequency, $f_{SWR}$ is the measured surface wave resonance frequency, and $f_{SWR}^{ideal}$ is the ideal surface wave resonance frequency.

Figure 7:
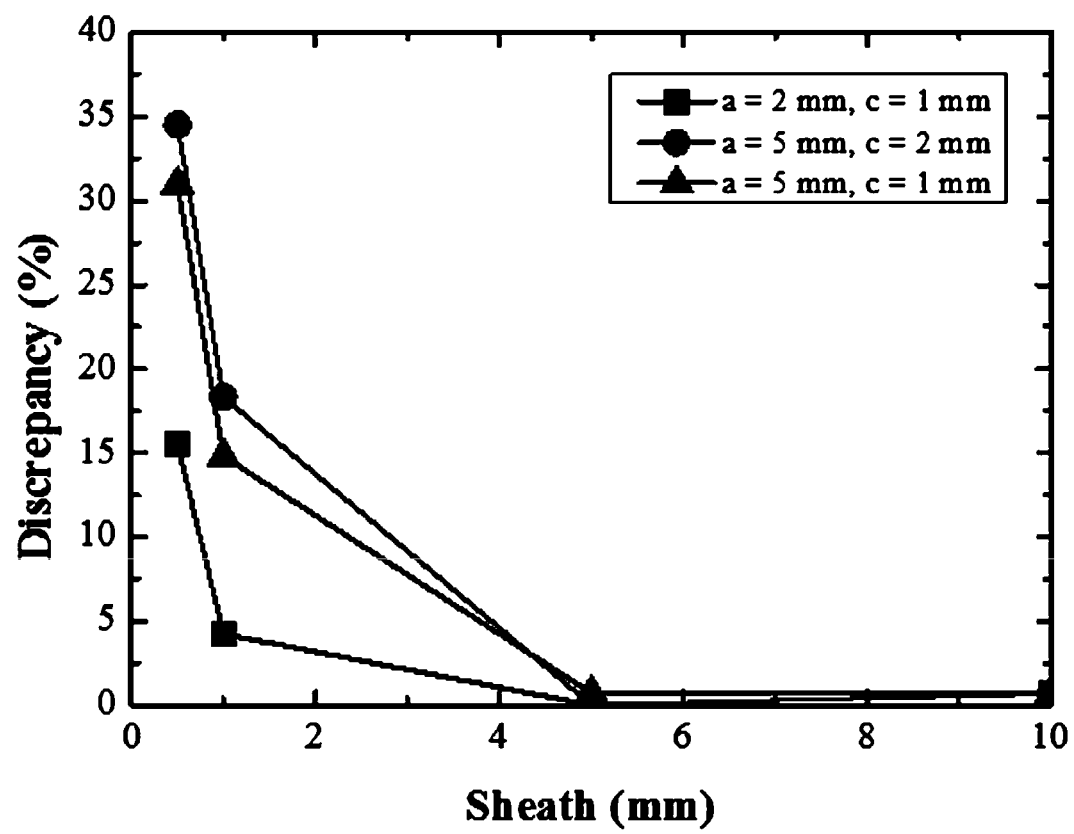
FIGS. 7, 8a, 8b, and 9 are graphs illustrating the discrepancy of a surface wave resonance frequency according to the embodiment of the present disclosure.

FIGS. 7, 8a, 8b, and 9 are graphs illustrating the discrepancy of the surface wave resonance frequency according to the embodiment of the present disclosure. That is, FIG. 7 is a graph illustrating the discrepancy of the surface wave resonance frequency according to the thickness of the sheath 22, and the diameter d of the coaxial core 110 and the thickness t of the dielectric of the coaxial peripheral 120 of the probe 100.

As illustrated in FIG. 7, as the thickness of the sheath 22 increases, the discrepancy of the surface wave resonance frequency decreases. Additionally, as the size of the antenna of the probe 100 (the diameter d of the coaxial core 110 and the thickness t of the dielectric of the coaxial peripheral 120) decreases, the discrepancy of the surface wave resonance frequency decreases.

That is, as the size of the antenna, which is the sum of the diameter d of the coaxial core 110 and the thickness t of the dielectric of the coaxial peripheral 120 of the probe 100, decreases, the discrepancy of the surface wave resonance frequency decreases. In FIG. 7, "a" indicates the diameter d of the coaxial core 110, and "c" indicates the thickness t of the dielectric of the coaxial peripheral 120.

In addition, in FIG. 7, the probe 100 in which the diameter d of the coaxial core 110 is 2.0 mm, and the thickness t of the dielectric of the coaxial peripheral 120 is 1.0 mm exhibits the smallest discrepancy that is optimized.

Accordingly, it is preferential that in order to reduce the discrepancy of the surface wave resonance frequency detected by using the probe 100, the size (the diameter d of the coaxial core 110 and the thickness t of the dielectric of the coaxial peripheral 120) of the probe 100 is relatively small. Additionally, multiple probes 100 formed to have small sizes are preferentially disposed inside the electrostatic chuck (ESC) 23 so as to correspond to the measurement position of the plasma 21.

Figure 8A:
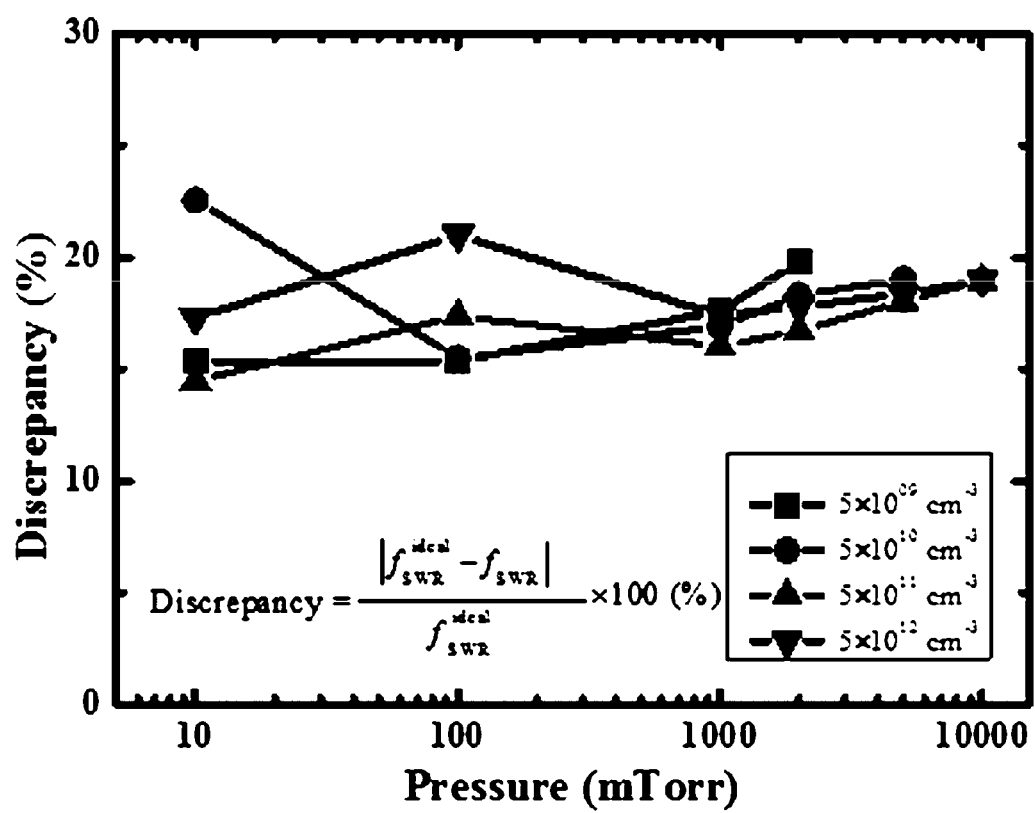
Figure 8B:
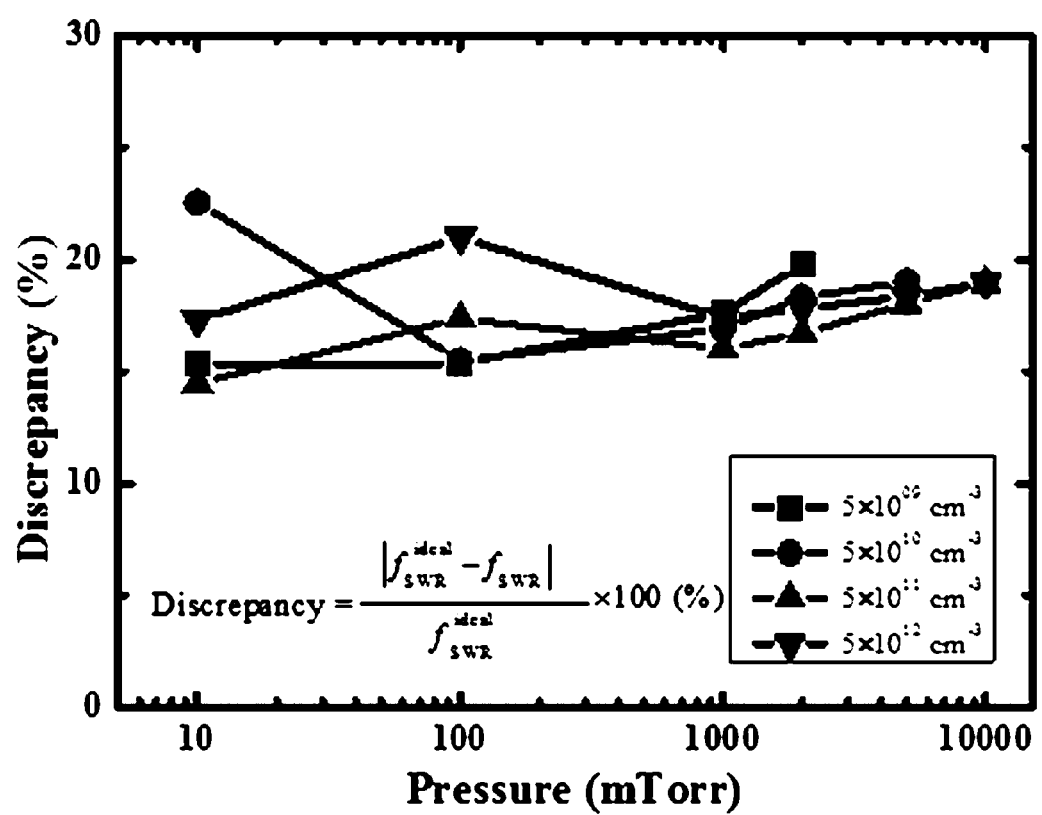

In addition, FIG. 8a is a graph illustrating the discrepancy of the surface wave resonance frequency according to pressure and the input electron density in a case in which the pressure is 1.0 torr, and the thickness of the sheath 22 is 5.0 mm, and FIG. 8b is a graph illustrating the discrepancy of the surface wave resonance frequency according to pressure and the input electron density in a case in which the pressure is 1.0 torr, and the thickness of the sheath 22 is 0.5 mm.

That is, FIGS. 8a and 8b illustrate the discrepancy of the surface wave resonance frequency in a case in which the input electron densities are $5\times10^{09}$ cm$^{-3}$, $5\times10^{10}$ cm$^{-3}$, $5\times10^{11}$ cm$^{-3}$, and $5\times10^{12}$ cm$^{-3}$. Additionally, FIGS. 8a and 8b illustrate the discrepancy of the surface wave resonance frequency in a range from pressure of 10 mTorr to pressure of 10 Torr.

These conditions are the conditions of the electron density and pressure of the plasma 21 used in a general process of the plasma 21.

Accordingly, as illustrated in 8a, it can be seen that the discrepancy of the surface wave resonance frequency is around 10% when the thickness of the sheath 22 is 5.0 mm. Additionally, as illustrated in FIG. 8b, it can be seen that the discrepancy of the surface wave resonance frequency is around 20% even when the thickness of the sheath 22 is 0.5 mm.

That is, the non-invasive diagnostic apparatus 10 for plasma processes according to the embodiment of the present disclosure can measure electron density with the discrepancy of 25% or less in the general process of the plasma 21. Particularly, when the thickness of the sheath 22 is 5.0 mm or more, the diagnostic apparatus 10 can measure electron density with the discrepancy of 15% or less.

Meanwhile, as illustrated in FIGS. 1 and 2, the probe 100 may be mounted to a side of the electrostatic chuck (ESC) 23 to be used, and may be mounted to the side wall of the chamber 20 in which the plasma 21 is generated to measure the electron density of the edge of the plasma 21.

In this case, discrepancy between each surface wave resonance frequencies can be extracted by using [Equation 5].

Figure 9:
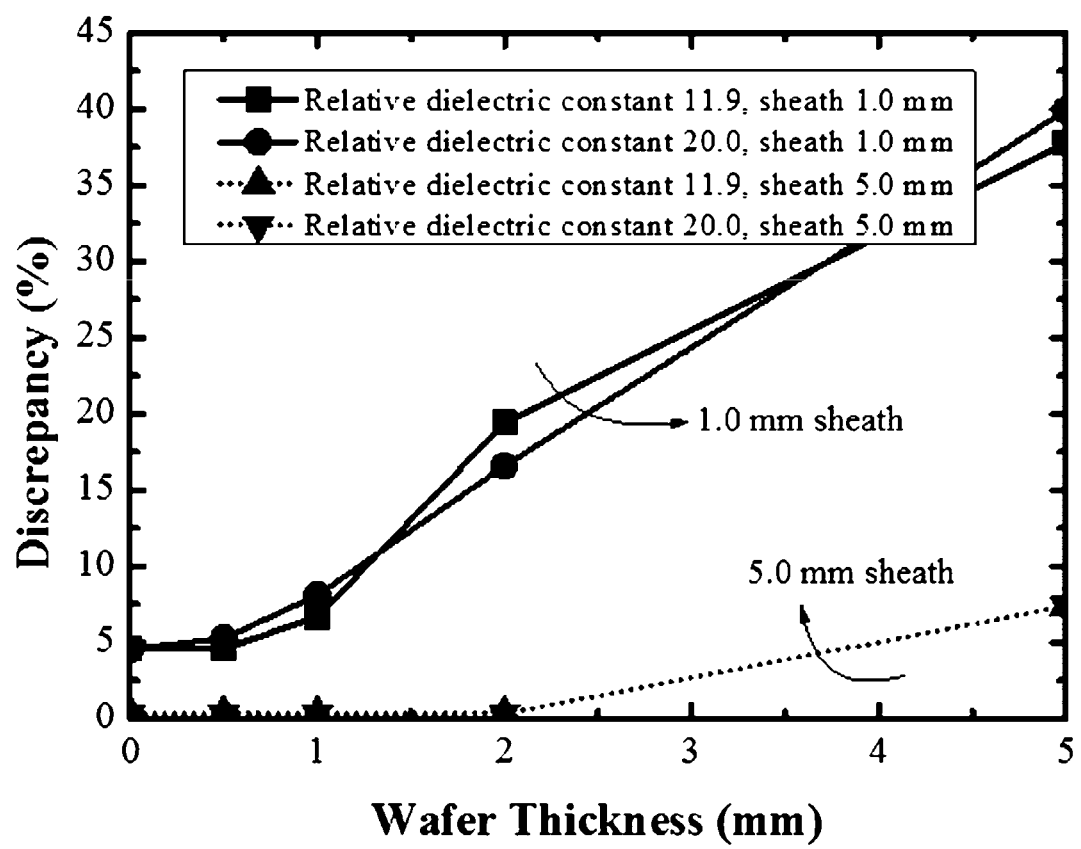

In addition, FIG. 9 is a graph illustrating the discrepancy of surface wave resonance frequency according to the thickness and dielectric constant of the wafer 24 and the thickness of the sheath 22 in a case in which the input electron density is $5\times10^{10}$ cm$^{-3}$, and pressure 1.0 torr.

That is, FIG. 9 is a graph illustrating the discrepancy of the surface wave resonance frequency according to the changes of the relative dielectric constant of the wafer 24, the thickness of the wafer 24, and the thickness of the sheath 22 when the wafer 24 is placed on the probe 100 as illustrated in FIG. 2.

Here, the discrepancy of the surface wave resonance frequency can be extracted by using [Equation 5].

As illustrated in FIG. 9, the discrepancy of the surface wave resonance frequency increases as the thickness of the wafer 24 increases. However, it can be seen that there is no change in the discrepancy of the surface wave resonance frequency according to the change of the relative dielectric constant of the wafer 24.

Accordingly, even if the wafer 24 is placed on the probe 100, the probe 100 can measure electron density with the discrepancy of 10% or less for the wafer 24 having the thickness of 1 mm or less. In general, the thickness of a silicon wafer 24 used in a semiconductor process is 1 mm or less.

Figure 10A:
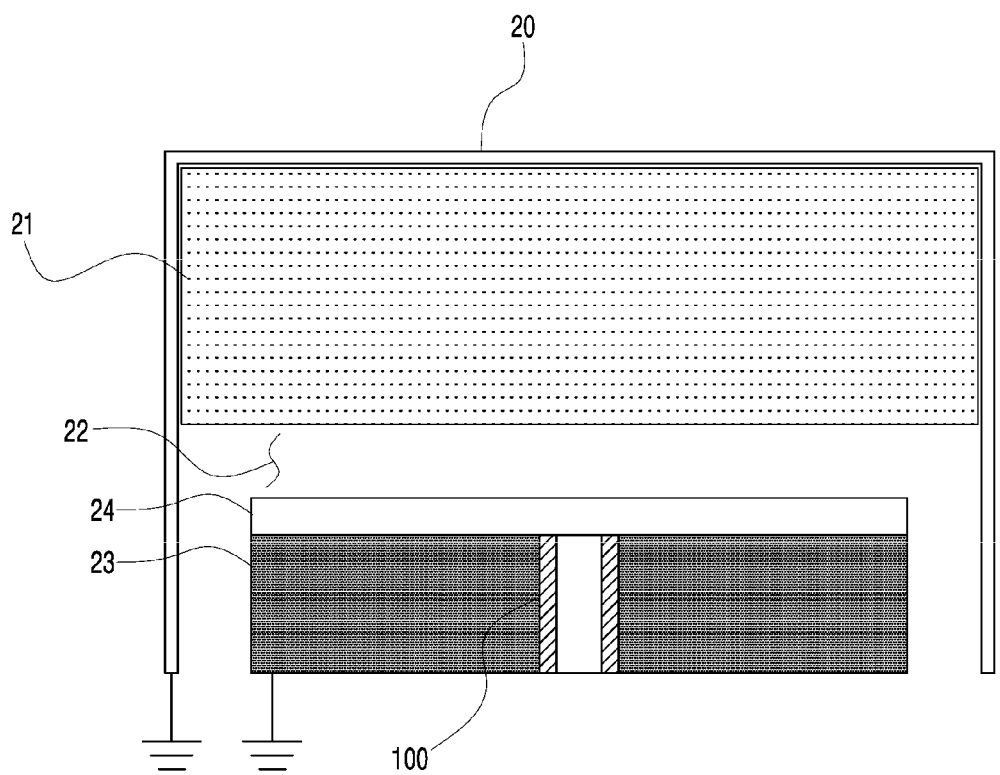
FIGS. 10a, 10b, 10c, and 10d are views illustrating the installation position of the probe according to the embodiment of the present disclosure.
Figure 10B:
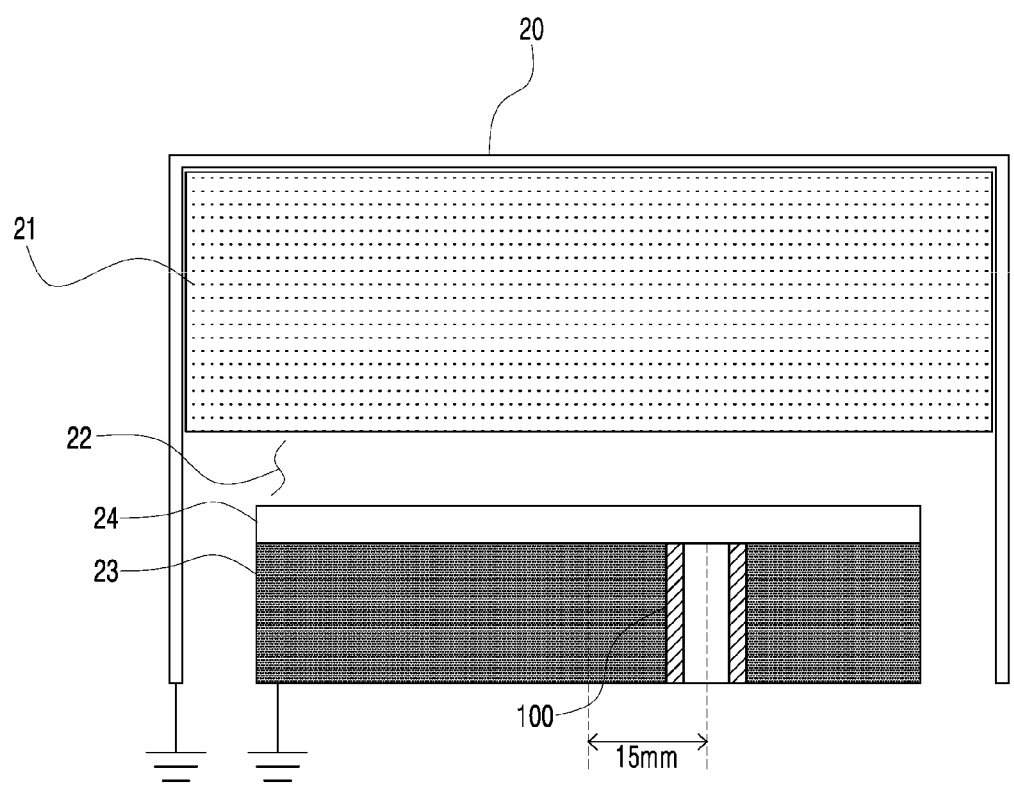

FIGS. 10a, 10b, 10c, and 10d are views illustrating the installation position of the probe 100 in the electrostatic chuck 23 in a case in which there is a chamber in which plasma 21 is generated according to the embodiment of the present disclosure. That is, FIG. 10a is a view illustrating a case in which the probe 100 is installed in the center of the electrostatic chuck 23, and FIG. 10b is a view illustrating a case in which the probe 100 is installed to be spaced apart by 15 mm from the center of the electrostatic chuck 23.

Figure 10C:
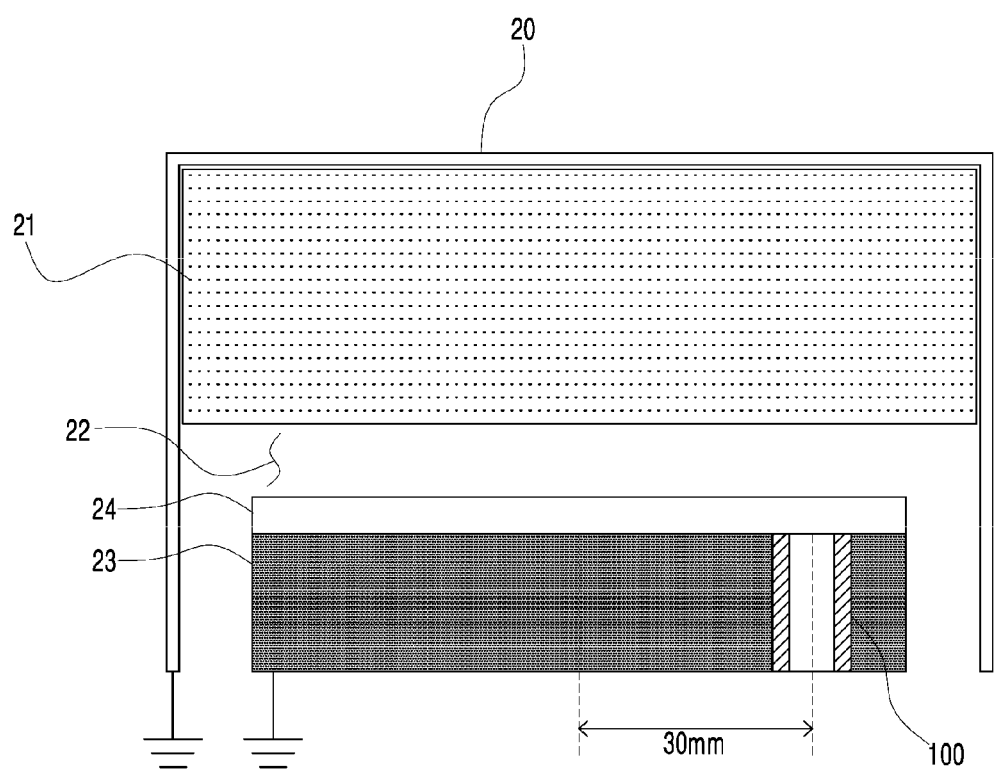
Figure 10D:
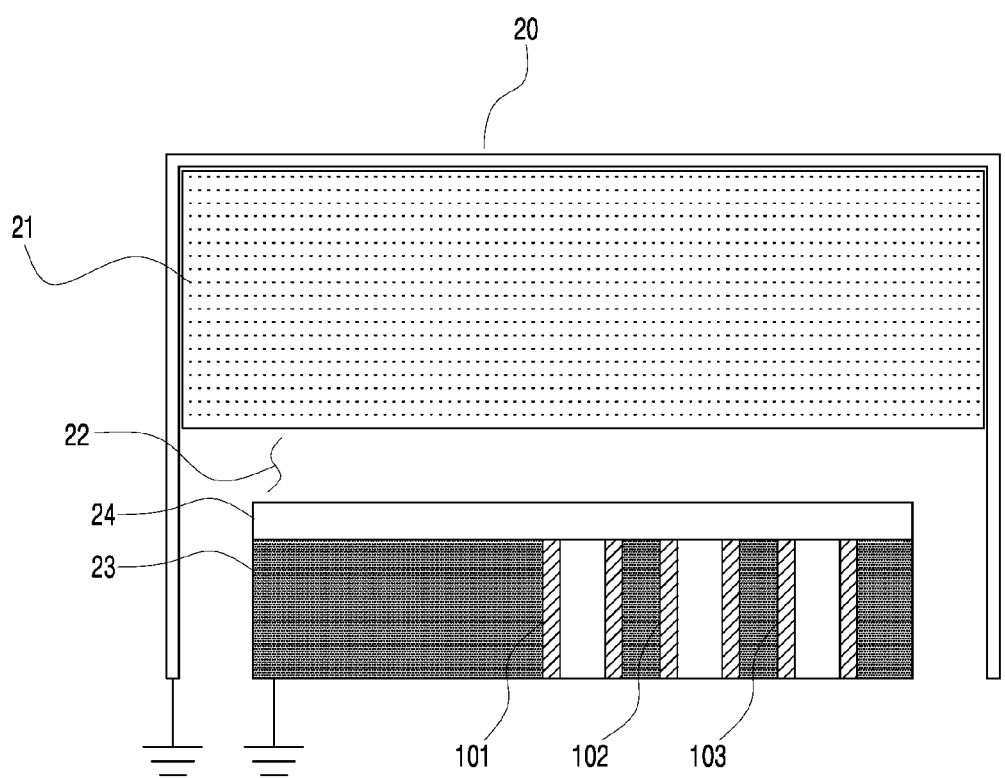

Furthermore, FIG. 10c is a view illustrating a case in which the probe 100 is installed to be spaced apart by 30 mm from the center of the electrostatic chuck 23, and FIG. 10d is a view illustrating a case in which a plurality of probes 101, 102, and 103 are installed in the electrostatic chuck 23.

FIG. 10d is a configuration view for simulation performed to analyze the effect of mutual interference between the probes 101, 102, and 103 when three probes 101, 102, and 103 are installed in one electrostatic chuck 23 according to the embodiment of the present disclosure.

Figure 11A:
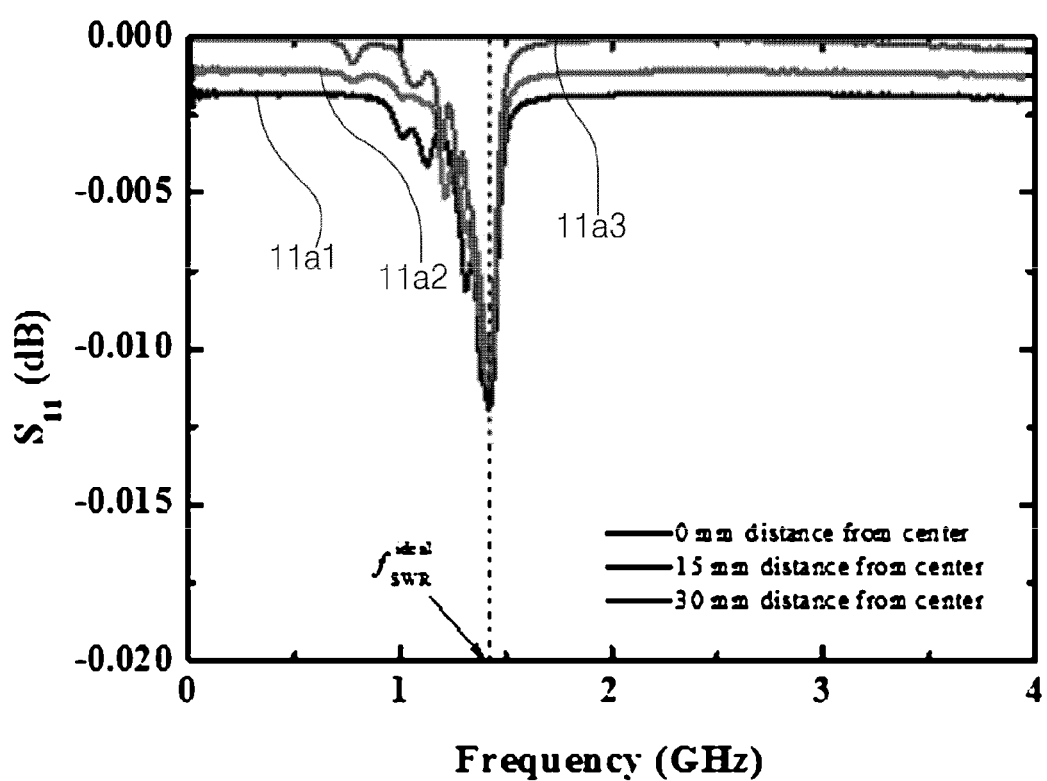
FIGS. 11a and 11b are graphs illustrating the reflection spectrum according to the change of the installation position of the probe of the present disclosure.
Figure 11B:
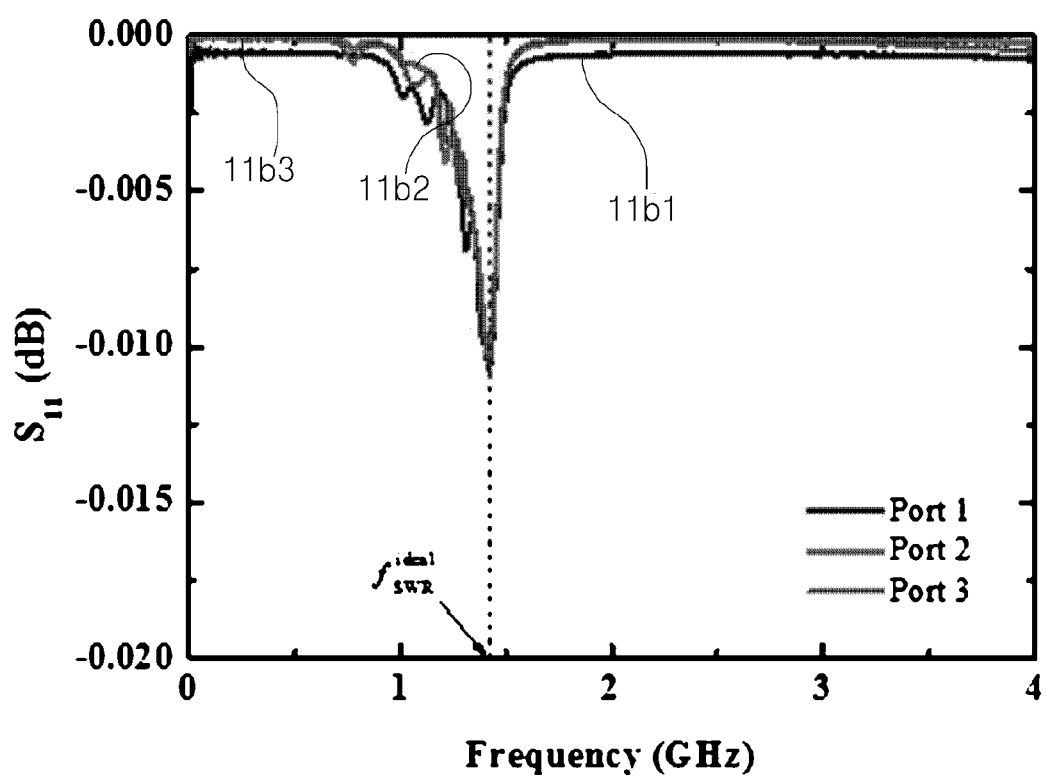

FIGS. 11a and 11b are graphs illustrating a reflection spectrum according to the change of the installation position of the probe 100 of the present disclosure. That is, FIG. 11a is a graph illustrating a reflection spectrum 11a1 measured by the probe 100 installed in the center of the electrostatic chuck 23 as illustrated in FIG. 10a, a reflection spectrum 11a2 measured by the probe 100 installed to be spaced apart by 15 mm from the center of the electrostatic chuck 23 as illustrated in FIG. 10b, and a reflection spectrum 11a3 measured by the probe 100 installed to be spaced apart by 30 mm from the center of the electrostatic chuck 23 as illustrated in FIG. 10c.

As illustrated in FIG. 11a, when the probe 100 is located in the chamber 20 in which the plasma 21 is generated or is installed at a position away from the center of the electrostatic chuck 23, the probe 100 can accurately measure surface wave resonance frequency $f_{SWR}$, and it can be seen that the measured frequency coincides with the ideal surface wave resonance frequency $f_{SWR}^{ideal}$.

In addition, FIG. 11b is a graph illustrating a reflection spectrum measured by each of the probes 101, 102, and 103 when the three probes 101, 102, and 103 are simultaneously installed in the electrostatic chuck 23 as illustrated in FIG. 10d.

That is, in FIG. 11b, a reflection spectrum 11b1 is a reflection spectrum measured by the probe 101 installed in the center of the electrostatic chuck 23 of FIG. 10d, a reflection spectrum 11b2 is a reflection spectrum measured by the probe 102 installed to be spaced apart by 15 mm from the center of the electrostatic chuck 23 of FIG. 10d, and a reflection spectrum 11b3 is a reflection spectrum measured by the probe 103 installed to be spaced apart by 30 mm from the center of the electrostatic chuck 23 of FIG. 10d.

It can be seen that even when the plurality of probes 100 is installed in the electrostatic chuck 23 as illustrated in FIG. 11b, a reflection spectrum does not change significantly and is accurately measured. That is, it can be seen that even when the plurality of probes 100 is installed in the electrostatic chuck 23, there is no effect of mutual interference between the probes 100.

Figure 12A:
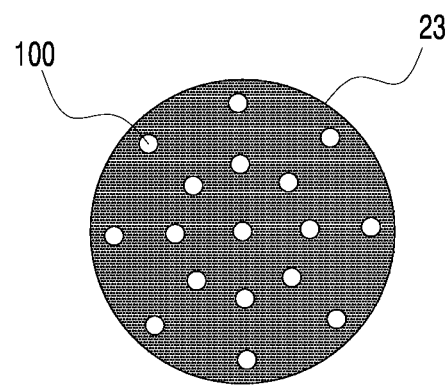
FIGS. 12a and 12b are views roughly illustrating the non-invasive diagnostic apparatus for plasma processes according to another embodiment of the present disclosure.
Figure 12B:
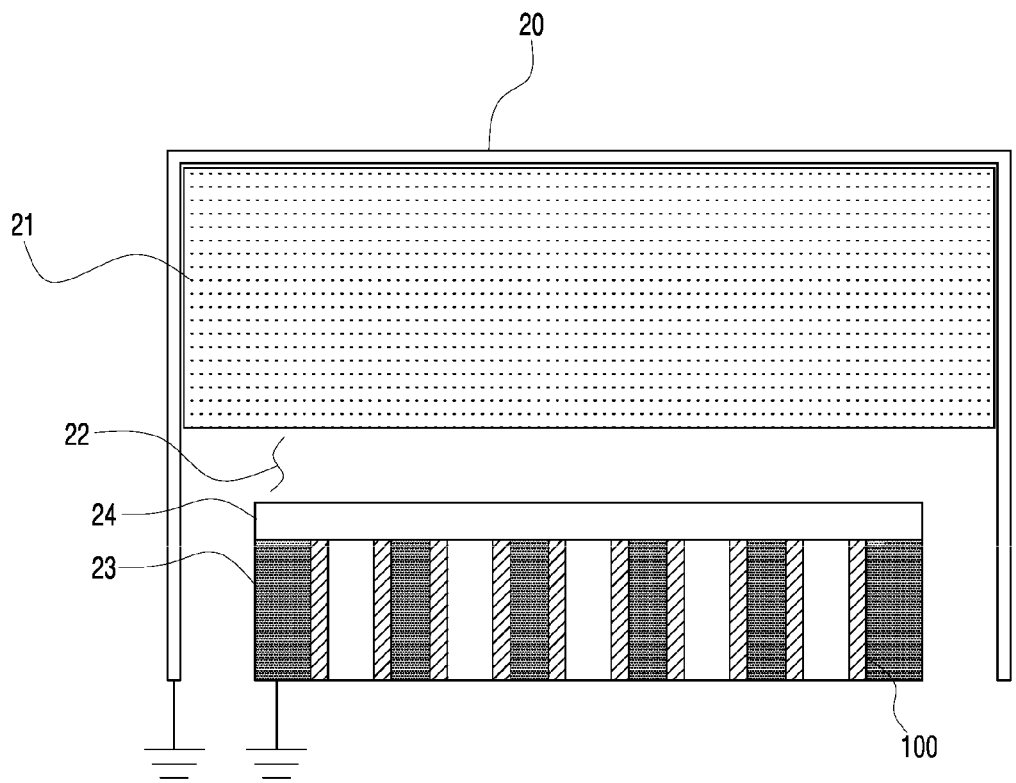
Figure 13:
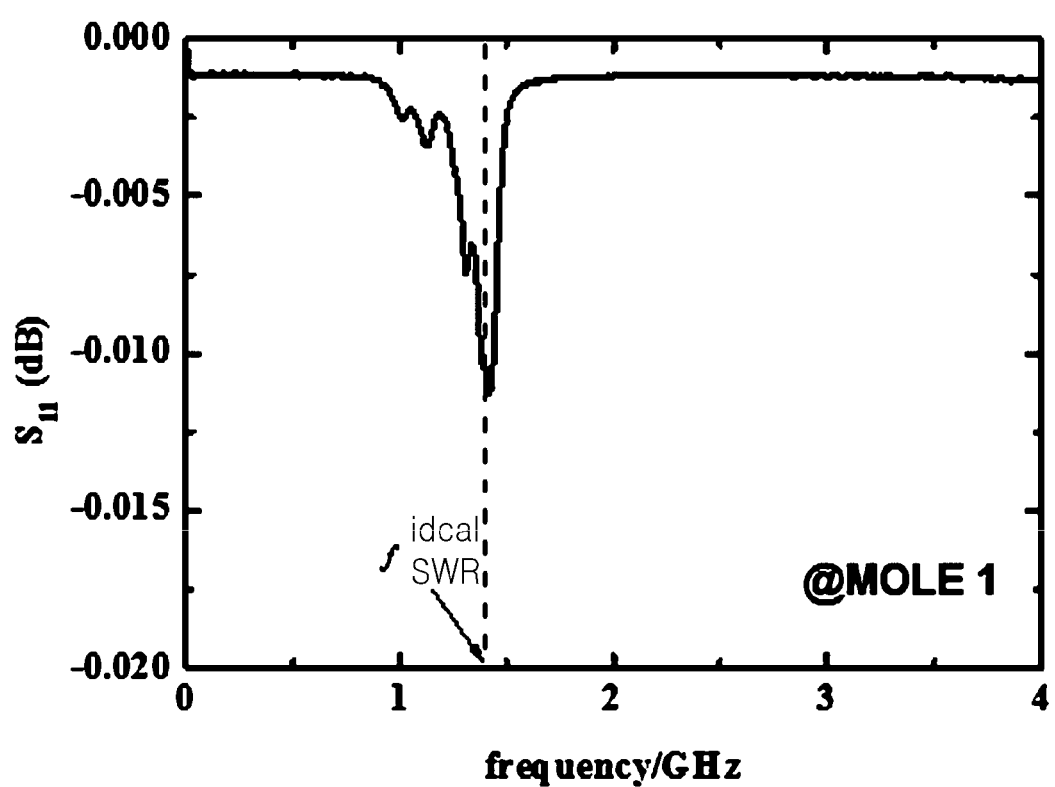
FIG. 13 is a graph illustrating a reflection spectrum measured by the probe of FIGS. 12a and 12b.

FIGS. 12a and 12b are views roughly illustrating the non-invasive diagnostic apparatus for plasma processes according to another embodiment of the present disclosure, and FIG. 13 is a graph illustrating a reflection spectrum measured by using the probe 100 of FIGS. 12a and 12b.

That is, FIG. 12a of an upper side in FIGS. 12a and 12b is a top plan view illustrating a state in which multiple probes 100 are disposed in the electrostatic chuck 23, and FIG. 12b of a lower side in FIGS. 12a and 12b, is a sectional view illustrating a state in which the electrostatic chuck 23 in which the multiple probes 100 are disposed is installed in the chamber 20.

FIG. 13 illustrates the reflection spectrum measured by a probe 100 located in the center of the electrostatic chuck 23 in FIG. 12a. It can be seen that even when the multiple probes 100 are installed in the electrostatic chuck 23 as illustrated in FIG. 13, the surface wave resonance frequency is accurately measured.

Accordingly, the non-invasive diagnostic apparatus 10 for plasma processes according to the embodiment of the present disclosure measures surface wave resonance frequency generated on a boundary surface of the plasma 21 or the sheath 22 from the reflection spectrum of the probe 100 measured through the electromagnetic simulation so as to measure the electron density and uniformity of the plasma 21.

Figure 14:
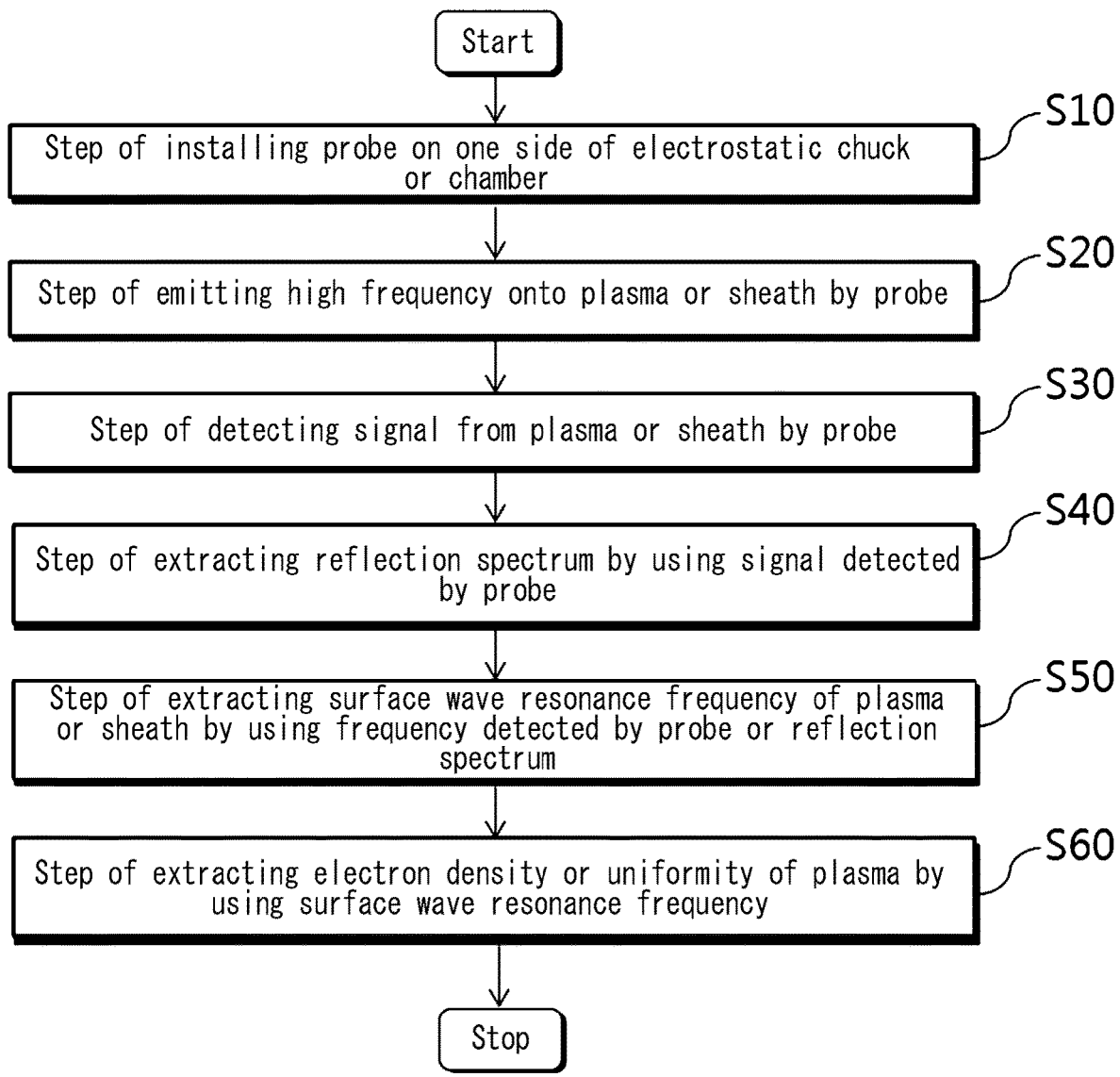
FIG. 14 is a flowchart illustrating a non-invasive diagnostic method for plasma processes according to the embodiment of the present disclosure.

FIG. 14 is a flowchart illustrating a non-invasive diagnostic method for plasma processes according to the embodiment of the present disclosure. The non-invasive diagnostic method for plasma processes according to the embodiment of the present disclosure may include a step (S10) of installing at least one probe 100 on one side of the electrostatic chuck (ESC) 23 or on the inner wall of the chamber 20, a step (S20) in which the control part 300 emits high frequency onto the plasma 21 or the sheath 22 by using the probe 100, and a step (S30) of detecting a frequency reflected from the plasma 21 or the sheath 22 by the probe 100.

In addition, the non-invasive diagnostic method for plasma processes may include a step in which the measuring unit 400 extracts the reflection spectrum by frequency by using the frequency detected by the probe 100 (S40), a step in which the calculation unit 500 extracts surface wave resonance frequency of the plasma 21 or the sheath 22 by using the frequency detected by the probe 100 or the reflection spectrum extracted by the measuring unit 400 (S50), and a step in which the calculation unit 500 extracts the electron density or uniformity of the plasma 21 on the basis of the surface wave resonance frequency (S60).

Accordingly, the non-invasive diagnostic method and apparatus 10 for plasma processes according to the embodiment of the present disclosure has the effect of achieving process stabilization and yield improvement by applying the technology of monitoring the plasma 21 in real time to an actual process.

Although the exemplary embodiments of the present disclosure have been described above, the present disclosure is not limited to the above embodiments, and the embodiments of the present disclosure include all changed embodiments within a range recognized as being easily changed and equivalent by those skilled in the technical field to which the present disclosure pertains.

DESCRIPTION OF THE REFERENCE
NUMERALS IN THE DRAWINGS

10: Diagnostic apparatus for plasma process 20: Chamber
21: Plasma 22: Sheath
23: Electrostatic chuck 24: Wafer
100, 101, 102, 103: Probe 110: Coaxial core
120: Coaxial peripheral 200: High frequency generation unit
300: Control part 400: Measuring unit
410: Ultrahigh frequency radiation/measurement system
420: Oscilloscope measurement system for pulse waves
500: Calculation unit 600: Storage part
700: Display part

The invention claimed is:

1. A non-invasive diagnostic method for diagnosing plasma generated in or introduced into a chamber in a plasma process, the method comprising:
    a step (S10) of installing at least one probe on one side of an electrostatic chuck (ESC) or an inner wall of the chamber;
    a step (S20) of emitting a high frequency onto the plasma or a sheath by the probe;
    a step (S30) of detecting a frequency reflected from the plasma or the sheath by the probe;
    a step (S40) of extracting a reflection spectrum by frequency by using the frequency detected by the probe;
    a step (S50) of extracting a surface wave resonance frequency of the plasma or the sheath by using the frequency detected by the probe or the reflection spectrum; and
    a step (S60) of extracting electron density or uniformity of the plasma on the basis of the surface wave resonance frequency,
    wherein the electron density of the plasma is calculated by using [Equation 1] below $$n_e = (f_{SWR}/6350)^{1/2}$$ [Equation 1]

wherein $n_e$ is the electron density of the plasma, and $f_{SWR}$ is the surface wave resonance frequency.

2. The method of claim 1, wherein the step (S40) of extracting the reflection spectrum by frequency comprises extracting the reflection spectrum by using an ultrahigh frequency radiation/measurement system or an oscilloscope measurement system for pulse waves.

3. The method of claim 1, wherein the step (S50) of extracting the surface wave resonance frequency comprises extracting a frequency having a minimum value from the reflection spectrum and setting the frequency as the surface wave resonance frequency.

4. A non-invasive diagnostic apparatus for diagnosing plasma generated in or introduced into a chamber in a plasma process, the apparatus comprising:
    a high frequency generation unit which generates a high frequency according to control of a control part and transmits the high frequency to a probe;
    the probe which emits the high frequency onto the plasma or a sheath, and detects a frequency reflected from the plasma or the sheath;
    a measuring unit which measures the frequency detected by the probe; and
    a calculation unit which calculates a surface wave resonance frequency of the plasma or the sheath by using the frequency detected by the probe or data measured by the measuring part, and extracts electron density or uniformity of the plasma by using the calculated surface wave resonance frequency,
    wherein the electron density of the plasma is calculated by using [Equation 1] below $$n_e = (f_{SWR}/6350)^{1/2}$$ [Equation 1]

wherein $n_e$ is the electron density of the plasma, and $f_{SWR}$ is the surface wave resonance frequency.

5. The apparatus of claim 4, wherein the probe is configured to have a shape of a coaxial cable, and a coaxial core of the probe is made of a metal material, and a coaxial peripheral of the probe is made of a dielectric.

6. The apparatus of claim 5, wherein to reduce discrepancy of the surface wave resonance frequency, a size (diameter of the coaxial core and thickness of the dielectric of the coaxial peripheral) of the probe is relatively small.

7. The apparatus of claim 4, wherein at least one probe is installed on an inner wall of the chamber or on one side of an electrostatic chuck (ESC) provided inside the chamber.

* * * * *